United States Patent
Lee et al.

(10) Patent No.: US 7,238,653 B2
(45) Date of Patent: Jul. 3, 2007

(54) CLEANING SOLUTION FOR PHOTORESIST AND METHOD FOR FORMING PATTERN USING THE SAME

(75) Inventors: Geun Su Lee, Gyeonggi-do (KR); Cheol Kyu Bok, Seoul (KR); Young Sun Hwang, Gyeonggi-do (KR); Sung Koo Lee, Seoul (KR); Seung Chan Moon, Gyeonggi-do (KR); Ki Soo Shin, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 427 days.

(21) Appl. No.: 10/723,029

(22) Filed: Nov. 26, 2003

(65) Prior Publication Data

US 2004/0180293 A1   Sep. 16, 2004

(30) Foreign Application Priority Data

Mar. 10, 2003  (KR) .................... 10-2003-0014796
Apr. 9, 2003   (KR) .................... 10-2003-0022273

(51) Int. Cl.
*C11D 1/72* (2006.01)

(52) U.S. Cl. ............... 510/175; 510/176; 510/245; 510/265

(58) Field of Classification Search ............... None
See application file for complete search history.

(56) References Cited

U.S. PATENT DOCUMENTS 3,953,386 A   4/1976   Murphy et al. ............... 260/17

(Continued)

FOREIGN PATENT DOCUMENTS

EP            0371804 B1   3/1993

(Continued)

OTHER PUBLICATIONS

Office action in corresponding Korean Application No. 2003-14796 dated Dec. 28, 2005.

(Continued)

*Primary Examiner*—Gregory Webb
(74) *Attorney, Agent, or Firm*—Marshall, Gerstein & Borun LLP

(57) ABSTRACT

Cleaning solutions for photoresist are disclosed which are useful for cleaning a semiconductor substrate in the last step of development when photoresist patterns are formed. Also, methods for forming photoresist patterns using the same are disclosed. The disclosed cleaning solution comprises $H_2O$ as a solution, a surfactant which is phosphate-alcoholamine salt represented by Formula 1, and an alcohol compound. The disclosed cleaning solution has lower surface tension than that of distilled water which has been used for conventional cleaning solutions, thereby improving resistance to photoresist pattern collapse and stabilizing the photoresist pattern formation.

Formula 1 wherein R, x, y, z, a and b are as defined in the specification.

23 Claims, 3 Drawing Sheets

U.S. PATENT DOCUMENTS

| | | | | |
|---|---|---|---|---|
| 4,169,068 A | * | 9/1979 | Harita et al. | 510/176 |
| 4,784,777 A | * | 11/1988 | Dellinger | 101/424.2 |
| 5,196,070 A | | 3/1993 | Ables et al. | 148/23 |
| 5,256,209 A | * | 10/1993 | Chihara et al. | 134/38 |
| 5,374,502 A | | 12/1994 | Tanaka et al. | |
| 5,474,877 A | | 12/1995 | Suzuki | |
| 6,232,280 B1 | * | 5/2001 | Shah et al. | 510/179 |
| 6,730,644 B1 | * | 5/2004 | Ishikawa et al. | 510/175 |
| 6,887,654 B2 | * | 5/2005 | Lundy et al. | 430/329 |
| 7,018,964 B2 | * | 3/2006 | Maeno et al. | 510/175 |
| 2002/0009674 A1 | * | 1/2002 | Nohara et al. | 430/311 |
| 2003/0152874 A1 | * | 8/2003 | Nakahara et al. | 430/323 |
| 2004/0002437 A1 | * | 1/2004 | Wilson | 510/407 |
| 2004/0104196 A1 | * | 6/2004 | Nakamura et al. | 216/2 |
| 2004/0106737 A1 | * | 6/2004 | Sugeta et al. | 525/206 |
| 2004/0121615 A1 | * | 6/2004 | Kaneko et al. | 438/758 |
| 2005/0009365 A1 | * | 1/2005 | Sugeta et al. | 438/781 |

FOREIGN PATENT DOCUMENTS

| | | |
|---|---|---|
| JP | 04-124668 | 4/1992 |

OTHER PUBLICATIONS

Search Report dated Jul. 9, 2004 from German Patent and Trademark Office.

* cited by examiner

CLEANING SOLUTION FOR PHOTORESIST AND METHOD FOR FORMING PATTERN USING THE SAME

TECHNICAL FIELD

Cleaning solutions for photoresist are disclosed which are useful for cleaning a semiconductor substrate in the last step of development when photoresist patterns are formed. More specifically, a cleaning solution for photoresist comprising $H_2O$ as a primary solvent, a surfactant of phosphate-alcoholamine salt as an additive and an alcohol compound, and a method for forming patterns using the same are disclosed.

DESCRIPTION OF THE RELATED ART

As semiconductor devices become smaller, the aspect ratio of the photoresist patterns (i.e. the ratio of the thickness of photoresist, or height to the linewidth of formed pattern) increases.

When the height of formed photoresist patterns extends beyond critical height, capillary force exceeds elasticity of photoresist, thereby resulting in collapse of patterns during a cleaning process.

In order to overcome this problem, adhesive force between underlying layers and photoresist is enhanced by increasing inner elasticity of photoresist or decreasing surface tension thereof.

Generally, a method of forming photoresist patterns on semiconductor substrates comprises the steps of: forming an underlying layer on a semiconductor substrate; forming a photoresist film on the underlying layer; and exposing a portion of the underlying layer by exposing and developing processes to form a photoresist pattern. In case of a positive photoresist, the photoresist film of an exposing region is removed by developing solution to form a photoresist pattern.

The last step of the above method is a cleaning process of removing the residual photoresist film by spraying distilled water from spin equipment while the semiconductor substrate is spun. In this process, the pattern is collapsed due to high surface tension of the distilled water.

Conventionally, U.S. Pat. No. 5,374,502 discloses that the collapse of photoresist patterns having high aspect ratios can be prevented by using a cleaning solution including tert-amyl alcohol, 2-methyl-1-butanol, 1-butanol, tert-butyl alcohol, 3-pentanol and isobutyl alcohol.

In addition, U.S. Pat. No. 5,474,877 discloses that the collapse of photoresist patterns can be prevented by using a cleaning solution whose surface tension is lowered by heat. However, neither solution provided by the prior art is ideal and therefore there is a continuing need for improved cleaning solutions that address the problems of high aspect ratio photoresist patterns.

SUMMARY OF THE DISCLOSURE

Accordingly, cleaning solutions for photoresist patterns is disclosed whose surface tension is lowered to prevent collapse of photoresist patterns in the last development process of removing the residual photoresist film. Also, methods for forming patterns using the same are disclosed.

DETAILED DESCRIPTION OF THE PRESENTLY PREFERRED EMBODIMENTS

Figure 1:
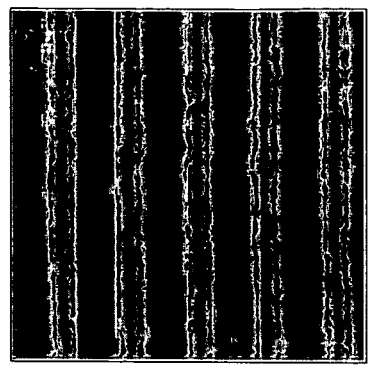
FIG. 1 is a photograph of a photoresist pattern obtained from Example 9.

A cleaning solution for photoresist comprises $H_2O$ as a solution and a compound represented by following Formula 1 as a surfactant:

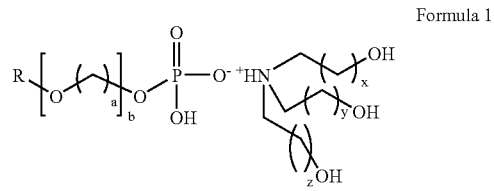

Formula 1 wherein

R is $C_2$-$C_{20}$ alkyl or $C_6$-$C_{25}$ alkyl aryl;

x, y and z individually are an integer ranging from 0 to 10;

a is 2 or 3; and b is an integer ranging from 2 to 50.

The compound of Formula 1 is water-soluble since which is salt. Also, the compound of Formula 1, which includes both a hydrophilic group such as a hydroxyl group and a hydrophobic group such as an alkyl group having a long chain in one molecule, remarkably lowers surface tension.

Preferably, the compound of Formula 1 which is phosphate-alcoholamine salt is represented by Formula 2 or Formula 3:

Formula 2

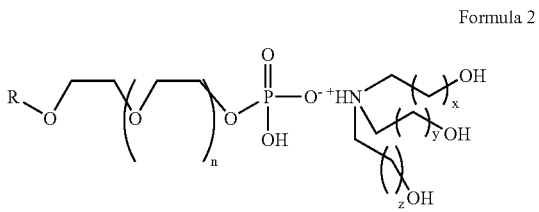

Formula 3

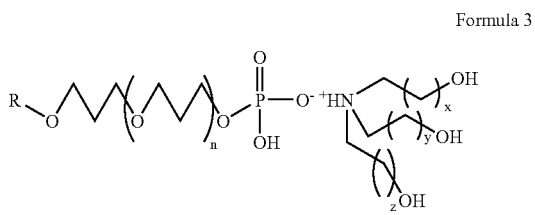

wherein

R is $C_2$-$C_{20}$ alkyl or $C_6$-$C_{25}$ alkyl aryl;

x, y and z individually are an integer ranging from 0 to 10; and n is an integer ranging from 1 to 49.

In the compound of Formula 2 or Formula 3, R is preferably $C_6$-$C_{14}$ alkyl or $C_{12}$-$C_{20}$ alkyl aryl, and more preferably selected from the group consisting of octyl, octyl phenyl, nonyl, nonyl phenyl, decyl, decyl phenyl, undecyl, undecyl phenyl, dodoecyl and dodecyl phenyl, n is an integer ranging from 5 to 10, and x, y and z individually are an integer ranging from 0 to 2.

More specifically, the compound of Formula 2 is selected from the group consisting of compound wherein R is nonyl, x, y and z are 1, and n is 7; compound wherein R is octyl, x, y and z are 1, and n is 7; compound wherein R is dodecyl, x, y and z are 0, and n is 7; and compound wherein R is octyl phenyl, x, y and z are 1, and n is 3.

Also, the compound of Formula 3 is selected from the group consisting of compound wherein R is nonyl, x, y and z are 1, and n is 7; compound wherein R is octyl, x, y and z are 1, and n is 7; compound wherein R is dodecyl, x, y and z are 0, and n is 7; and compound wherein R is octyl phenyl, x, y and z are 1, and n is 3.

The water of the disclosed cleaning solution is preferably distilled water.

The disclosed water further comprises an alcohol.

The above alcohol comprises $C_1$-$C_{10}$ alkyl alcohol or $C_1$-$C_{10}$ alkoxyalkyl alcohol. Preferably, the $C_1$-$C_{10}$ alkyl alcohol is selected from the group consisting of methanol, ethanol, propanol, isopropanol, n-butanol, sec-butanol, t-butanol, 1-pentanol, 2-pentanol, 3-pentanol, 2,2-dimethyl-1-propanol and mixtures thereof, and the $C_1$-$C_{10}$ alkoxyalkyl alcohol is selected from the group consisting of 2-methoxyethanol, 2-(2-methoxyethoxy)ethanol, 1-methoxy-2-propanol, 3-methoxy-1,2-propandiol and mixtures thereof.

In the disclosed cleaning solution, the compound of Formula 1, which is a surfactant, is present in an amount ranging from 0.001 to 2 wt % based on the total weight of said solution, and the alcohol is present in an amount ranging from 0 to 20 wt % based on the total weight of said solution.

When the compound of Formula 1 is present in the amount of less than 0.001 wt %, the effect of lowering surface tension is degraded. When the compound of Formula 1 is present in the amount of more than 2 wt %, the effect of lowering surface tension is also degraded, and the residual compound of Formula 1 remains on the wafer.

In addition, when the alcohol is present in the amount of more than 20 wt %, the alcohol dissolves photoresist materials, thereby collapsing patterns.

Specifically, the compound of Formula 2 is present in an amount ranging from 0.001 to 2 wt %, more preferably, from 0.01 to 1 wt % based on the total weight of said solution, and the alcohol is present in an amount ranging from 0 to 20 wt %, more preferably, from 0.01 to 10 wt % based on the total weight of said solution.

The compound of Formula 3, which is a surfactant, is present in an amount ranging from 0.001 to 2 wt %, more preferably, from 0.001 to 1 wt % based on the total weight of said solution, and the alcohol is present in an amount ranging from 0 to 10 wt %, more preferably, from 0.001 to 5 wt % based on the total weight of said solution.

The disclosed cleaning solution is manufactured by filtering the resulting mixture of the distilled water, the compound of Formula 1 and the alcohol with 0.2 μm filter.

A method for forming a photoresist pattern comprises:

(a) preparing a semiconductor substrate on which an underlying layer is formed;

(b) coating a photoresist on the underlying layer to form a photoresist film;

(c) exposing the photoresist film to light;

(d) developing the exposed photoresist film; and (e) cleaning the resulting structure using a disclosed cleaning solution.

The above method further comprises soft baking step before part (c) or post baking step after part (c). Preferably, the bake process is performed at a temperature ranging from 70 to 200° C.

In the above the exposure step, the source of the light is preferably selected from the group consisting of KrF (248 nm), ArF (193 nm), VUV (157 nm), EUV (13 nm), E-beam, X-ray and ion-beam. The exposure step is preferably performed at exposure energy ranging from 0.1 to 50 $mJ/cm^2$.

The above development step (d) is performed with an alkaline developing solution which is preferably TMAH aqueous solution ranging from 0.01 to 5 wt %.

As described above, the collapse of photoresist patterns can be prevented by performing the cleaning process using the disclosed cleaning solution including the compound of Formula 1 which is a surfactant to lower surface tension of the cleaning solution.

Additionally, a semiconductor device manufactured according to the process described above is disclosed.

The disclosed cleaning solution for photoresist will be described in more details referring to examples below, when are not intended to be limiting.

EXAMPLE 1

Preparation of Cleaning Solution and Measurement of Surface Tension

The compound of Formula 2 wherein R is nonyl, x, y and z are 1, respectively, and n is 7 (0.3 g), methanol (1 g) and distilled water (99 g) were stirred for 1 minute. The resulting mixture was filtered through a 0.2 μm filter to obtain a disclosed cleaning solution. The surface tension of the disclosed cleaning solution measured by a KRUSS K9 tension meter of measurement equipment was 31N $m/m^2$.

EXAMPLE 2

Preparation of Cleaning Solution and Measurement of Surface Tension

The compound of Formula 2 wherein R is octyl, x, y and z are 1, respectively, and n is 7 (0.3 g), methanol (1 g) and distilled water (99 g) were stirred for 1 minute. The resulting mixture was filtered through a 0.2 µm filter to obtain a disclosed cleaning solution. The surface tension of the disclosed cleaning solution measured by a KRUSS K9 was 32N m/m$^2$.

EXAMPLE 3

Preparation of Cleaning Solution and Measurement of Surface Tension

The compound of Formula 2 wherein R is dodecyl, x, y and z are 0, respectively, and n is 7 (0.3 g), isopropanol (1 g) and distilled water (99 g) were stirred for 1 minute. The resulting mixture was filtered through a 0.2 µm filter to obtain a disclosed cleaning solution. The surface tension of the disclosed cleaning solution measured by a KRUSS K9 was 28N m/m$^2$.

EXAMPLE 4

Preparation of Cleaning Solution and Measurement of Surface Tension

The compound of Formula 2 wherein R is octyl phenyl, x, y and z are 1, respectively, and n is 3 (0.3 g), isopropanol (1 g) and distilled water (99 g) were stirred for 1 minute. The resulting mixture was filtered through a 0.2 µm filter to obtain a disclosed cleaning solution. The surface tension of the disclosed cleaning solution measured by a KRUSS K9 was 29N m/m$^2$.

EXAMPLE 5

Preparation of Cleaning Solution and Measurement of Surface Tension

The compound of Formula 3 wherein R is nonyl, x, y and z are 1, respectively, and n is 7 (0.3 g), methanol (1 g) and distilled water (99 g) were stirred for 1 minute. The resulting mixture was filtered through a 0.2 µm filter to obtain a disclosed cleaning solution. The surface tension of the disclosed cleaning solution measured by a KRUSS K9 was 34N m/m$^2$.

EXAMPLE 6

Preparation of Cleaning Solution and Measurement of Surface Tension

The compound of Formula 3 wherein R is octyl, x, y and z are 1, respectively, and n is 7 (0.3 g), methanol (1 g) and distilled water (99 g) were stirred for 1 minute. The resulting mixture was filtered through a 0.2 µm filter to obtain a disclosed cleaning solution. The surface tension of the disclosed cleaning solution measured by a KRUSS K9 was 37N m/m$^2$.

EXAMPLE 7

Preparation of Cleaning Solution and Measurement of Surface Tension

The compound of Formula 3 wherein R is dodecyl, x, y and z are 0, respectively, and n is 7 (0.3 g), isopropanol (1 g) and distilled water (99 g) were stirred for 1 minute. The resulting mixture was filtered through a 0.2 µm filter to obtain a disclosed cleaning solution. The surface tension of the disclosed cleaning solution measured by a KRUSS K9 was 33N m/m$^2$.

EXAMPLE 8

Preparation of Cleaning Solution and Measurement of Surface Tension

The compound of Formula 3 wherein R is octyl phenyl, x, y and z are 1, respectively, and n is 3 (0.3 g), isopropanol (1 g) and distilled water (99 g) were stirred for 1 minute. The resulting mixture was filtered through a 0.2 µm filter to obtain a disclosed cleaning solution. The surface tension of the disclosed cleaning solution measured by a KRUSS K9 was 37N mm$^2$.

COMPARATIVE EXAMPLE 1

Measurement of Surface Tension of Distilled Water

The surface tension of the distilled water as measured by the KRUSS K9 was 73N m/m$^2$.

EXAMPLE 9

Formation of Photoresist Pattern

After an underlying layer was formed on a silicon wafer treated with hexamethyldisilazane (HMDS), a photoresist comprising methacrylate type compound, sold under the designation "AX1020P" by Clariant, was spin-coated on the silicon wafer at a thickness 2400 Å to form a photoresist film, and soft-backed at 130° C. for 90 seconds. After soft-baking, the photoresist film was exposed to light using an ArF laser exposer, and then post-baked at 130° C. for 90 seconds. When the post-baking was completed, it was developed in 2.38 wt % aqueous TMAH solution for 30 seconds. While the silicon wafer was spun, the silicon wafer was cleaned by spraying the cleaning solution (30 ml) obtained from Example 1 from the spin equipment and then dehydrated, to obtain 90 nm L/S photoresist pattern (see FIG. 1).

EXAMPLE 10

Formation of Photoresist Pattern

Figure 2:
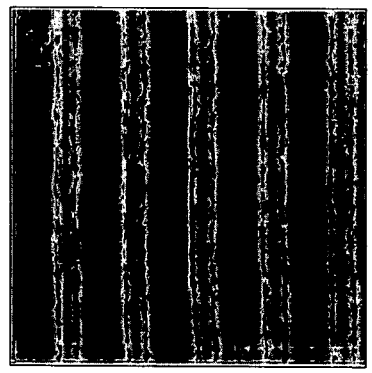
FIG. 2 is a photograph of a photoresist pattern obtained from Example 10.

The procedure of Example 9 was repeated using the cleaning solution of Example 2 instead of the cleaning solution of Example 1 to obtain 90 nm L/S photoresist pattern (see FIG. 2).

EXAMPLE 11

Formation of Photoresist Pattern

Figure 3:
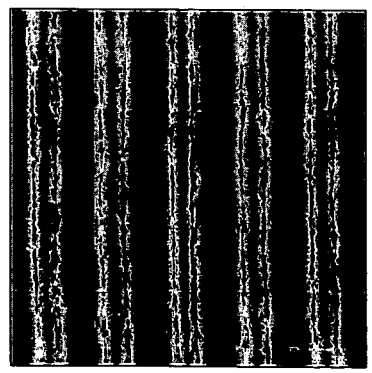
FIG. 3 is a photograph of a photoresist pattern obtained from Example 11.

The procedure of Example 9 was repeated using the cleaning solution of Example 3 instead of the cleaning solution of Example 1 to obtain 90 nm L/S photoresist pattern (see FIG. 3).

EXAMPLE 12

Formation of Photoresist Pattern

Figure 4:
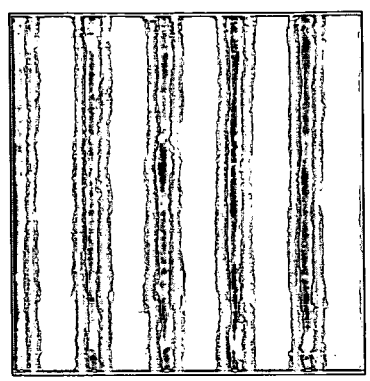
FIG. 4 is a photograph of a photoresist pattern obtained from Example 12.

The procedure of Example 9 was repeated using the cleaning solution of Example 4 instead of the cleaning solution of Example 1 to obtain 90 nm L/S photoresist pattern (see FIG. 4).

EXAMPLE 13

Formation of Photoresist Pattern

Figure 5:
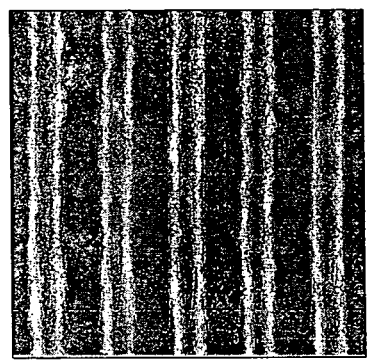
FIG. 5 is a photograph of a photoresist pattern obtained from Example 13.

The procedure of Example 9 was repeated using the cleaning solution of Example 5 instead of the cleaning solution of Example 1 to obtain 90 nm L/S photoresist pattern (see FIG. 5).

EXAMPLE 14

Formation of Photoresist Pattern

Figure 6:
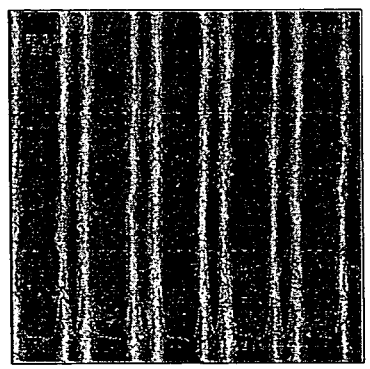
FIG. 6 is a photograph of a photoresist pattern obtained from Example 14.

The procedure of Example 9 was repeated using the cleaning solution of Example 6 instead of the cleaning solution of Example 1 to obtain 90 nm L/S photoresist pattern (see FIG. 6).

EXAMPLE 15

Formation of Photoresist Pattern

Figure 7:
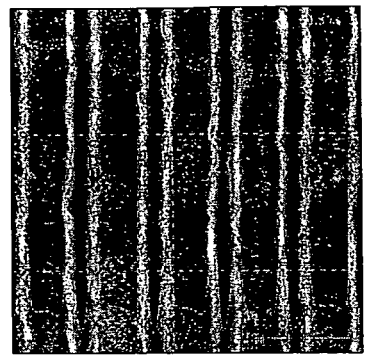
FIG. 7 is a photograph of a photoresist pattern obtained from Example 15.

The procedure of Example 9 was repeated using the cleaning solution of Example 7 instead of the cleaning solution of Example 1 to obtain 90 nm L/S photoresist pattern (see FIG. 7).

EXAMPLE 16

Formation of Photoresist Pattern

Figure 8:
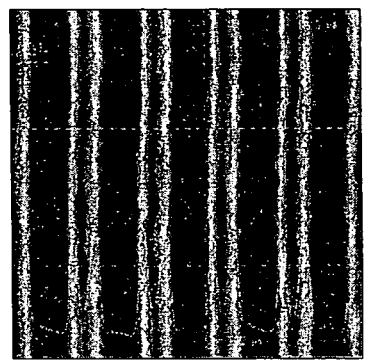
FIG. 8 is a photograph of a photoresist pattern obtained from Example 16.

The procedure of Example 9 was repeated using the cleaning solution of Example 8 instead of the cleaning solution of Example 1 to obtain 90 nm L/S photoresist pattern (see FIG. 8).

COMPARATIVE EXAMPLE 2

Formation of Photoresist Pattern

Figure 9:
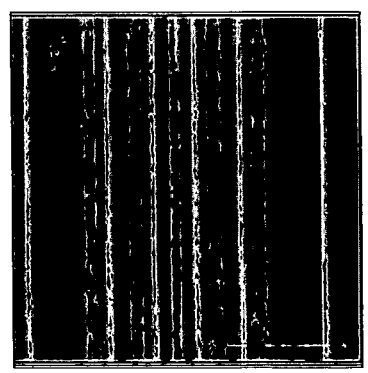
FIG. 9 is a photograph of a photoresist pattern obtained from Comparative Example 2.

The procedure of Example 9 was repeated using the distilled water instead of the cleaning solution of Example 1 to obtain a photoresist pattern. As a result, the photoresist pattern collapsed (see FIG. 9).

As shown in the above Examples, the collapse of patterns can be avoided by using the disclosed cleaning solution in the last step of the development because the disclosed cleaning solution has a lower surface tension than distilled water which has been used in conventional cleaning solutions. Accordingly, the disclosed cleaning solution may enable stabilization of development processes for forming ultrafine photoresist patterns of less than 130 nm.

What is claimed is:

1. A cleaning solution for photoresist patterns comprising:
   $H_2O$ as a solvent; and
   a compound represented by following Formula 1 as a surfactant:

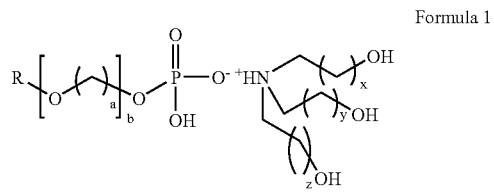

Formula 1 wherein
R is $C_2$-$C_{20}$ alkyl or $C_6$-$C_{25}$ alkyl aryl;
x, y and z individually are an integer ranging from 0 to 10;
a is 2 or 3; and
b is an integer ranging from 2 to 50.

2. The cleaning solution according to claim 1, wherein the b is an integer ranging from 6 to 11.

3. The cleaning solution according to claim 1, further comprising an alcohol.

4. The cleaning solution according to claim 1, wherein the compound of Formula 1 is present in an amount ranging from 0.001 to 2 wt % based on the total weight of said solution.

5. The cleaning solution according to claim 3 wherein the alcohol is present in an amount ranging from 0 to 20 wt % based on the total weight of said solution.

6. The cleaning solution according to claim 1 wherein the compound of Formula 1 is represented by Formula 2 or Formula 3:

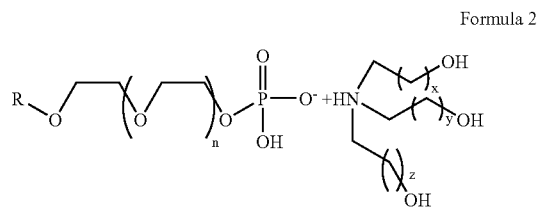

Formula 2

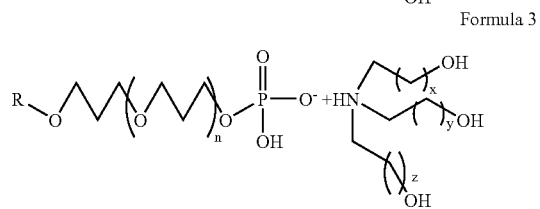

Formula 3 wherein
R is $C_2$-$C_{20}$ alkyl or $C_6$-$C_{25}$ alkyl aryl;
x, y and z individually are an integer ranging from 0 to 10; and
n is an integer ranging from 1 to 49.

7. The cleaning solution according claim 6, wherein the compound of Formula 2 is present in an amount ranging from 0.001 to 2 wt % based on the total weight of said solution, and the alcohol is present in an amount ranging from 0 to 20 wt % based on the total weight of said solution.

8. The cleaning solution according to claim 6, wherein the compound of Formula 3 is present in an amount ranging from 0.001 to 2 wt % based on the total weight of said solution, and the alcohol is present in an amount ranging from 0 to 10 wt % based on the total weight of said solution.

9. The cleaning solution according to claim 7, wherein the compound of Formula 2 is present in an amount ranging from 0.01 to 1 wt % based on the total weight of said solution, and the alcohol is present in an amount ranging from 0.01 to 10 wt % based on the total weight of said solution.

10. The cleaning solution according to claim 8, wherein the compound of Formula 3 is present in an amount ranging from 0.001 to 1 wt % based on the total weight of said solution, and the alcohol is present in an amount ranging from 0.001 to 5 wt % based on the total weight of said solution.

11. The cleaning solution according to claim 6, wherein R is selected from the group consisting of octyl, octyl phenyl, nonyl, nonyl phenyl, decyl, decyl phenyl, undecyl, undecyl phenyl, dodoecyl and dodecyl phenyl, and n is an integer ranging from 5 to 10.

12. The cleaning solution according to claim 3, wherein the alcohol is selected from the group consisting of $C_1$-$C_{10}$ alkyl alcohol, $C_1$-$C_{10}$ alkoxyalkyl alcohol, and mixtures thereof.

13. The cleaning solution according to claim 12, wherein the $C_1$-$C_{10}$ alkyl alcohol is selected from the group consisting of methanol, ethanol, propanol, isopropanol, n-butanol, sec-butanol, t-butanol, 1-pentanol, 2-pentanol, 3-pentanol, 2,2-dimethyl-1-propanol and mixtures thereof.

14. The cleaning solution according to claim 12, wherein the $C_1$-$C_{10}$ alkoxyalkyl alcohol is selected from the group consisting of 2-methoxyethanol, 2-(2-methoxyethoxy)ethanol, 1-methox-2-propanol, 3-methoxy-1,2-propandiol and mixtures thereof.

15. The cleaning solution according to claim 1, wherein the solution is selected from the group consisting of
mixture comprising the compound of Formula 2 as a surfactant wherein R is nonyl; x, y and z are 1, respectively; and n is 7, methanol as an alcohol and water as a solvent;
mixture comprising the compound of Formula 2 as a surfactant wherein R is octyl; x, y and z are 1, respectively; and n is 7, methanol as an alcohol and water as a solvent;
mixture comprising the compound of Formula 2 as a surfactant wherein R is dodecyl; x, y and z are 0, respectively; and n is 7, isopropanol as an alcohol and water as a solvent;
mixture comprising the compound of Formula 2 as a surfactant wherein R is octyl phenyl; x, y and z are 1, respectively; and n is 3, isopropanol as an alcohol and water as a solvent;
mixture comprising the compound of Formula 3 as a surfactant wherein R is nonyl; x, y and z are 1, respectively; and n is 7, methanol as an alcohol and water as a solvent;
mixture comprising the compound of Formula 3 as a surfactant wherein R is octyl; x, y and z are 1, respectively; and n is 7, methanol as an alcohol and water as a solvent;
mixture comprising the compound of Formula 3 as a surfactant wherein R is dodecyl; x, y and z are 0, respectively; and n is 7, isopropanol as an alcohol and water as a solvent; and
mixture comprising the compound of Formula 3 as a surfactant wherein R is octyl phenyl; x, y and z are 1, respectively; and n is 3, isopropanol as an alcohol and water as a solvent.

16. The cleaning solution according to claim 15, wherein the surfactant of Formula 2 is present in an amount ranging from 0.001 to 2 wt % based on the total weight of said mixture, and the alcohol is present in an amount ranging from 0 to 20 wt % based on the total weight of said mixture.

17. The cleaning solution according to claim 15, wherein the surfactant of Formula 3 is present in an amount ranging from 0.001 to 2 wt % based on the total weight of said mixture, and the alcohol is present in an amount ranging from 0 to 10 wt % based on the total weight of said mixture.

18. The cleaning solution according to claim 16, wherein the surfactant of Formula 2 is present in an amount ranging from 0.01 to 1 wt % based on the total weight of said mixture, and the alcohol is present in an amount ranging from 0.01 to 10 wt % based on the total weight of said mixture.

19. The cleaning solution according to claim 17, wherein the surfactant of Formula 3 is present in an amount ranging from 0.001 to 1 wt % based on the total weight of said mixture, and the alcohol is present in an amount ranging from 0.001 to 5 wt % based on the total weight of said mixture.

20. A method for forming a photoresist pattern, comprising:
(a) preparing a semiconductor substrate on which an underlying layer is formed;
(b) coating a photoresist on the underlying layer to form a photoresist film;
(c) exposing the photoresist film to light;
(d) developing the exposed photoresist film; and
(e) cleaning the resulting structure using the cleaning solution of claim 1.

21. The method according to claim 20, further comprising soft baking step before part (c) or post baking step after part (c).

22. The method according to claim 20, wherein the source of the light is selected from the group consisting of KrF (248 nm), ArF (193 nm), VUV (157 nm), EUV (13 nm), E-beam, X-ray and ion-beam.

23. A semiconductor device manufactured by the method of claim 20.

* * * * *